United States Patent
Mei et al.

(10) Patent No.: US 11,594,682 B2
(45) Date of Patent: Feb. 28, 2023

(54) SEMICONDUCTING POLYMER BLENDS FOR HIGH TEMPERATURE ORGANIC ELECTRONICS

(71) Applicant: Purdue Research Foundation, West Lafayette, IN (US)

(72) Inventors: Jianguo Mei, West Lafayette, IN (US); Aristide Gumyusenge, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 17/530,414

(22) Filed: Nov. 18, 2021

(65) Prior Publication Data

US 2022/0149285 A1 May 12, 2022

Related U.S. Application Data

(62) Division of application No. 16/422,665, filed on May 24, 2019, now Pat. No. 11,183,638.

(Continued)

(51) Int. Cl.
*H01L 51/00* (2006.01)
*H01L 51/05* (2006.01)

(52) U.S. Cl.
CPC ........ *H01L 51/0036* (2013.01); *H01L 51/004* (2013.01); *H01L 51/0007* (2013.01);
(Continued)

(58) Field of Classification Search
CPC ............. H01L 51/0036; H01L 51/0007; H01L 51/0028; H01L 51/0035; H01L 51/004;
(Continued)

(56) References Cited

U.S. PATENT DOCUMENTS

2017/0200896 A1\* 7/2017 Ong ..................... C09D 11/106
2019/0010276 A1\* 1/2019 Goto .................... C08G 61/124

FOREIGN PATENT DOCUMENTS

WO WO-2013052153 A1 \* 4/2013 ........... C07D 471/06

OTHER PUBLICATIONS

Yuan et al., ("Ultra-high mobility transparent organic thin film transistors grown by an off-center spin-coating method") nature communications. (Year: 2013).\*

\* cited by examiner

*Primary Examiner* — Ahmed N Sefer
(74) *Attorney, Agent, or Firm* — Purdue Research Foundation

(57) ABSTRACT

A composition for use as an electronic material. The composition contains at least one organic semiconducting material, and at least one electrically insulating polymer forming a semiconducting blend wherein the insulating polymer acts as a matrix for the organic semiconducting material resulting in an interpenetrating morphology of the polymer and the semiconductor material. The variation of charge carrier mobility with temperature in the semiconducting blend is less than 20 percent in a temperature range. A method of making a film of an electronic material. The method includes dissolving at least one organic semiconducting material and at least one insulating polymer into an organic solvent in a pre-determined ratio resulting in a semiconducting blend, depositing the blend onto a substrate to form a film comprising an interpenetrating morphology of the at least one insulating polymer and the at least one organic semiconductor material.

6 Claims, 21 Drawing Sheets

Related U.S. Application Data

(60) Provisional application No. 62/677,648, filed on May 29, 2018.

(52) U.S. Cl.
CPC ...... H01L 51/0028 (2013.01); H01L 51/0035 (2013.01); H01L 51/0042 (2013.01); H01L 51/0043 (2013.01); H01L 51/0545 (2013.01); H01L 51/0566 (2013.01)

(58) Field of Classification Search
CPC .............. H01L 51/0042; H01L 51/0043; H01L 51/0545; H01L 51/0566
See application file for complete search history.

SEMICONDUCTING POLYMER BLENDS FOR HIGH TEMPERATURE ORGANIC ELECTRONICS

CROSS-REFERENCE TO RELATED APPLICATIONS

The present U.S. patent application is a divisional of U.S. patent application Ser. No. 16/422,665, filed May 24, 2019, and is related to and claims the priority benefit of U.S. Provisional Patent Application No. 62/677,648 filed May 29, 2018, the contents of which are hereby incorporated by reference in their entirety into the present disclosure.

STATEMENT REGARDING GOVERNMENT FUNDING

This invention was made with government support under N00014-16-1-2551 awarded by the Office of Naval Research. The government has certain rights in the invention.

TECHNICAL FIELD

This disclosure relates to methods and compositions for a class of organic materials that are suitable for electronic devices, which could function at high temperatures.

BACKGROUND

This section introduces aspects that may help facilitate a better understanding of the disclosure. Accordingly, these statements are to be read in this light and are not to be understood as admissions about what is or is not prior art.

Organic electronics is increasingly becoming a reality as a new form of electronic devices. For electronics that must operate in harsh environments, specifically at elevated temperatures, novel class of materials are needed. In the ubiquitous inorganics, the electronic functionalities decline at high temperatures due to increased carrier densities, junction leakages, and lowered charge carrier mobility. To improve the device performances and lifetimes in these harsh conditions, wide-band gap materials and increased amounts of insulating components have been demonstrated. Organic semiconductors present a novel class of materials for electronics that must operate at high temperatures owing to their tunable energy band gaps as well as their unique thermally-activated charge transport feature. With increasing temperature, the hoping charge transport is commonly favored in organics leading to improved performances. However, this thermally-activated charge transport becomes hampered by unstable morphologies and disrupted molecular packing at high temperatures. Despite the increasing demand for high-temperature electronics, little to none has been reported to date on designing organic materials that can withstand elevated temperatures, especially at temperatures above 125° C.

For the forgoing reasons, there is an unmet need for approaches that can lead to organic semiconductors with high-temperature capability that can be deployed in electronic devices operable at high temperatures.

SUMMARY

A composition for use as an electronic material is disclosed. The composition contains at least one organic semiconducting material, and at least one electrically insulating polymer with a glass transition temperature in the range of 120-400° C., forming a semiconducting blend wherein the insulating polymer acts as a host or a matrix for the organic semiconducting material. The at least one insulating polymer and the at least one semiconducting material together form an interpenetrating morphology of the at least one insulating polymer and the at least one organic semiconductor material. Further, the variation of charge carrier mobility in the semiconducting blend in the electronic material with temperature is less than 20 percent in a temperature range of 25 to t ° C., where t° C. is less than the glass transition temperature of the at least one insulating polymer.

A method of making a film of an electronic material is disclosed. The method includes dissolving at least one organic semiconducting material and at least one insulating polymer into an organic solvent in a pre-determined ratio resulting in a semiconducting blend, depositing the blend onto a substrate to form a film, and evaporating the organic solvent, resulting in a semiconducting film. In the semiconducting film formed, the at least insulating polymer acts as a matrix for the at least one organic semiconducting material and the at least one insulating polymer and the at least one organic semiconducting material together form an interpenetrating morphology of the at least one insulating polymer and the at least one organic semiconductor material.

BRIEF DESCRIPTION OF DRAWINGS

Some of the figures shown herein may include dimensions. Further, some of the figures shown herein may have been created from scaled drawings or from photographs that are scalable. It is understood that such dimensions or the relative scaling within a figure are by way of example, and not to be construed as limiting.

DETAILED DESCRIPTION

Figure 1A:
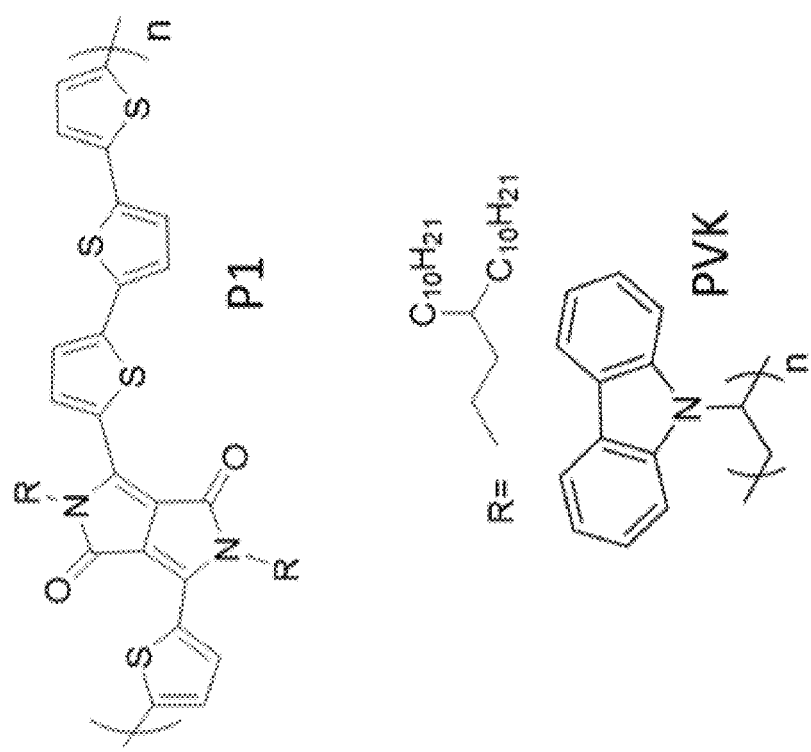
FIG. 1A shows chemical structures of diketopyrrolopyrrole-thiophene (P1), the semiconducting polymer, and polyvinyl carbazole (PVK) the matrix polymer.

Semiconducting properties are shown to be hampered by elevated temperatures both in organic and inorganic materials. Inorganic semiconductors which commonly possess narrow band-gaps suffer from uncontrolled thermal doping, and organic counterparts, despite their wider band-gaps, exhibit unstable morphologies at high temperatures. In this disclosure, polymer blends comprising a high-glass transition matrix and a conjugated semiconductor designed to yield thermally-stable morphologies for high-temperature organic thin-films transistors are described. The blending allows for the vitrification of the conjugated component into interdigitated semiconducting crystalline channels confined within the rigid matrix domains. Optimized confinement and minimized vibrational rearrangements could be realized via morphology control. Thin-film transistor devices made thereof exhibited thermally stable hole transport at temperatures as high as 220° C.

One way to achieve thermally-stable morphologies and thermally stable device performance, especially in conjugated polymer thin-films, is to design high-glass transition systems which would not soften at elevated temperatures. In experiments leading to this disclosure, a semiconducting polymer blend system of a conjugated polymer, and a high-glass transition host matrix are described to demonstrate transistor devices that can retain hole mobility as high as 2.5 cm²/Vs up to 220° C. as illustrated in figures to be described below.

In experiments leading to this disclosure, semiconductor polymers designated as P1 (poly(diketopyrrolopyrrole-co-thiophene)), P2 (Poly(diketopyrrolopyrrole-co-thienothiophene)) and P3 (Poly(isoindigo-co-thiophene) for purposes of this disclosure were synthesized as reported in literature. The composition and structure of these polymers P1, P2 and P3 are described later in this detailed description. High-glass transition host matrix materials designated as poly(N-vinyl carbazole (PVK), polyacenaphthylene (PAC) and Poly(methyl methacrylate) (PMMA) (the chemical names are described later in this description) were purchased from Sigma Aldrich and used as received. Other materials, Polycarbonate (PC), polyetherimide (PEI) and Matrimid 5218 (MI) were purchased from PolyK Technologies and used as received for the purpose of this disclosure. All polymers and blends prepared for purposes of the studies leading to this disclosure were dissolved in chloroform (10 mg/ml) and allowed to stir overnight at 40° C. The films for OFET (Organic Field effect Transistors) devices, X-ray diffraction, and AFM (atomic force microscope) characterization were spin-cast from the chloroform solutions (2000 rpm, 1 minute were the spin casting parameters).

In experiments leading to this disclosure, OFET devices were fabricated and tested. The procedure used is described below: Si/SiO₂ substrates with Au electrodes were first cleaned using piranha solution (2 vol. 18M sulfuric acid: 1 vol. 30% hydrogen peroxide), followed by copious rinsing with water, and then sonicated in isopropanol and acetone for five minutes in each solvent. The cleaned and dried substrates were then modified with a self-assembled monolayer of octadodecyltrichlorosilane. Bottom gate, bottom contact OFET devices were then fabricated by spin-coating at ambient. The fabricated devices were then annealed at 220° C. for at least 30 minutes to remove their thermal history inside a N2 glovebox and allowed to slowly cool to ambient before the electrical measurements. Charge carrier mobility measurements were carried out using Keithley 4200 at ambient and inside the glovebox. OFET performances were obtained by applying a gate bias from −60 V to 6 V, with the potential gradient between the source and drain contacts kept at −60 V. The OFET channel width and length were kept at 1400 and 50 μm, respectively. The thermal stability was evaluated using in-situ temperature-dependent measurement and a Caikang CK-400 hot plate was used to regulate the temperature. Prior to each measurement, the temperature was first allowed to stabilize, and the devices were heated for at least 30 minutes at each temperature.

In experiments leading to this disclosure, procedures adopted for morphology and crystallinity analysis of the polymers were as follows: Polymer thin films were spin cast on cleaned and OTS-modified Si/SiO₂ substrates. The film thickness was measured to be around 170 nm when chloroform was used as a solvent. AFM images were taken using Cypher Asylum AFM and processed through Gwyddion Software. For the in-situ temperature dependent morphology study, the films were first annealed and allowed to cool. The films were first imaged with the stage temperature maintained to 25° C. The sample stage temperature was then increased to 120° C., the instrument limitation, and the films were re-imaged for comparison. The same samples were further heated to 220° C. in open air and re-imaged. To evaluate the crystallinity stability, the films were first annealed to 220° C. and slowly cooled to ambient. GIXD scans were subsequently taken at corresponding temperatures.

In experiments leading to this disclosure, glass transition measurements were conducted as follows: DSC measurements were carried out using 4 mg of polymer materials with the heating cycle ranging from −30° C. to 300° C. (20° C./min). The DSC second cycles were used for Tg extraction. For the fully conjugated polymer which showed no detectable DSC signal, temperature-dependent UV-Vis measurement were used to extract the glass transition temperature of the studied semiconducting polymers in their thin film form as previously reported. Briefly, polymer thin films were spin cast onto cleaned glass substrates from chloroform solutions. In-situ temperature-dependent UV-Vis measurement were carried using a Carry 3000 UV-Vis couple with a cryo-chamber for temperature control. The spectra at different temperature were thus used for Tg extraction using Python and the computing tools available at https://github.com/seroot/UV_VIS_TG.

Figure 1B:
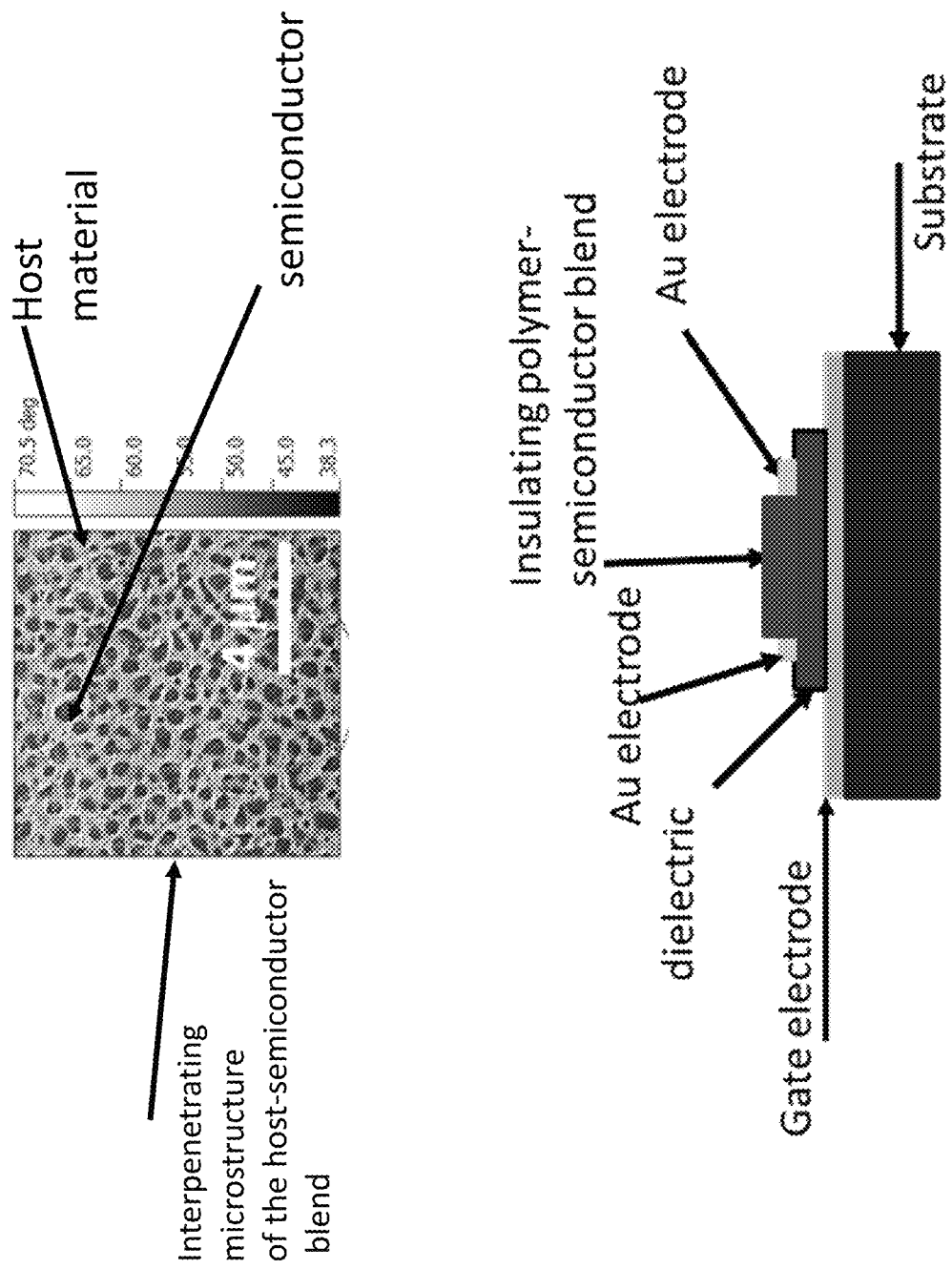
FIG. 1B is a schematic representation of a device structure of a thermally-stable OFET based on a binary blend comprising a semiconducting polymer vitrified with a high-$T_g$ polymer host. The micrograph in FIG. 1B represents the atomic force microscope (AFM) phase image demonstrating the interpenetrating morphology of the host-semiconductor blend.

Polycarbazole was selected as the host matrix owing to its high glass transition temperature and its ability to serve as a host semiconducting polymer. FIG. 1A shows the composition and structure of semiconductor polymer P1 and high-glass transition host matrix material PVK. FIG. 1B is a schematic representation of a device structure of a thermally-stable OFET based on a binary blend comprising a semiconducting polymer vitrified with a high-$T_g$ polymer host. The schematic in FIG. 1B shows the polymer insulator-semiconductor blend of this disclosure. The micrograph in FIG. 1B represents the atomic force microscope (AFM) phase image demonstrating the interpenetrating morphology of the host-semiconductor blend. The white areas represent the insulating polymer host while the black areas represent the organic semiconductor. An Interpenetrating morphology is a polymer blend comprising two or more types of polymers which are at least partially interlaced but not covalently bonded to each other. The two or more networks can be envisioned to be entangled in such a way that they are concatenated and cannot be pulled apart, but not bonded to each other by any chemical bond.

Figure 1C:
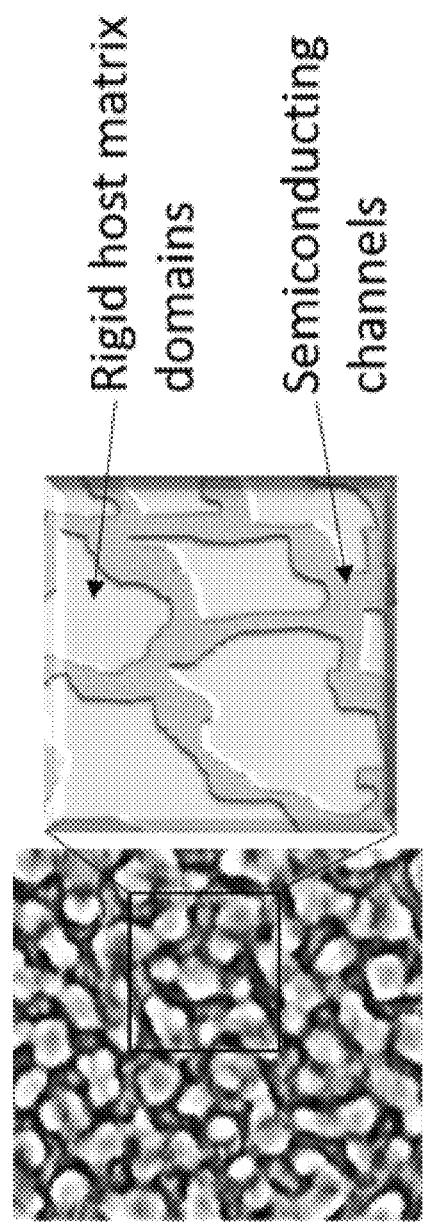
FIG. 1C is a schematic illustration of the blending design with the semiconducting polymer dispersed within rigid host islands.
Figure 1D:
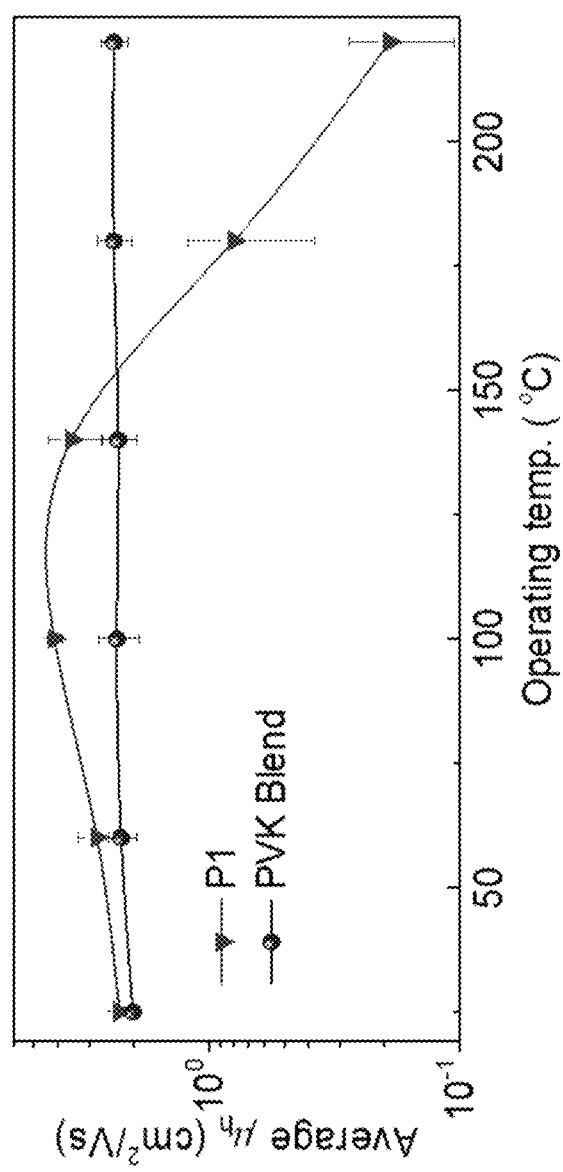
FIG. 1D shows measured hole mobilities for OFET devices based on (40 P1)/(60 PVK) blends at different temperatures at ambient compared with pure P1.
Figure 1E:
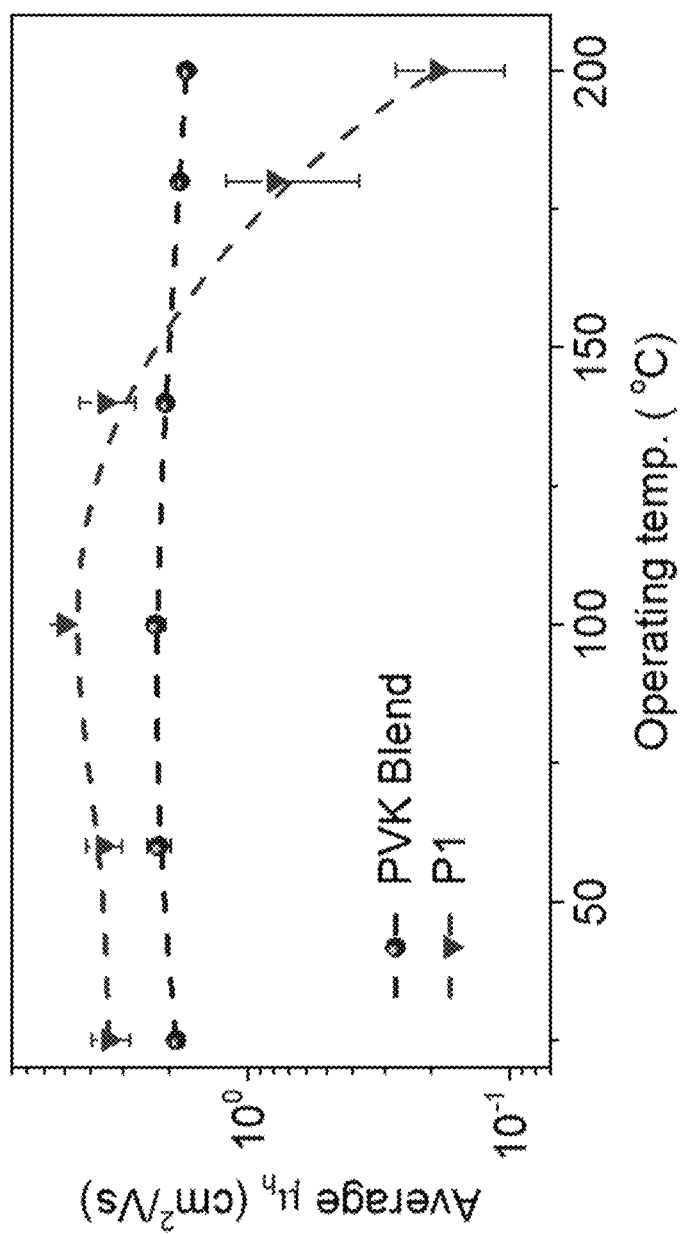
FIG. 1E shows measured hole mobilities for OFET devices based on (40 P1)/(60 PVK) blends at different temperatures inside a nitrogen filled glovebox in comparison with pure P1.

FIG. 1C is a schematic illustration of the blending design with the semiconducting polymer dispersed within rigid host islands. Referring to FIG. 1C, the rigid host matrix domains comprise the insulating polymer host such as PVK while the black the semiconducting channels represent the organic semiconductor such as P1. FIG. 1D shows measured hole motilities for OFET devices based on (40 P1)/(60 PVK) blends at different temperatures at ambient compared with pure P1. The blends revealed thermally-stable interdigitated crystalline domains of the conjugated polymer within the matrix domains (FIG. 1C). The locally-fixed morphology thus enabled the blends to outperform the pure semiconducting polymer at temperatures above 150° C., both in ambient and inert conditions as shown in FIG. 1D and FIG. 1E.

Figure 2A:
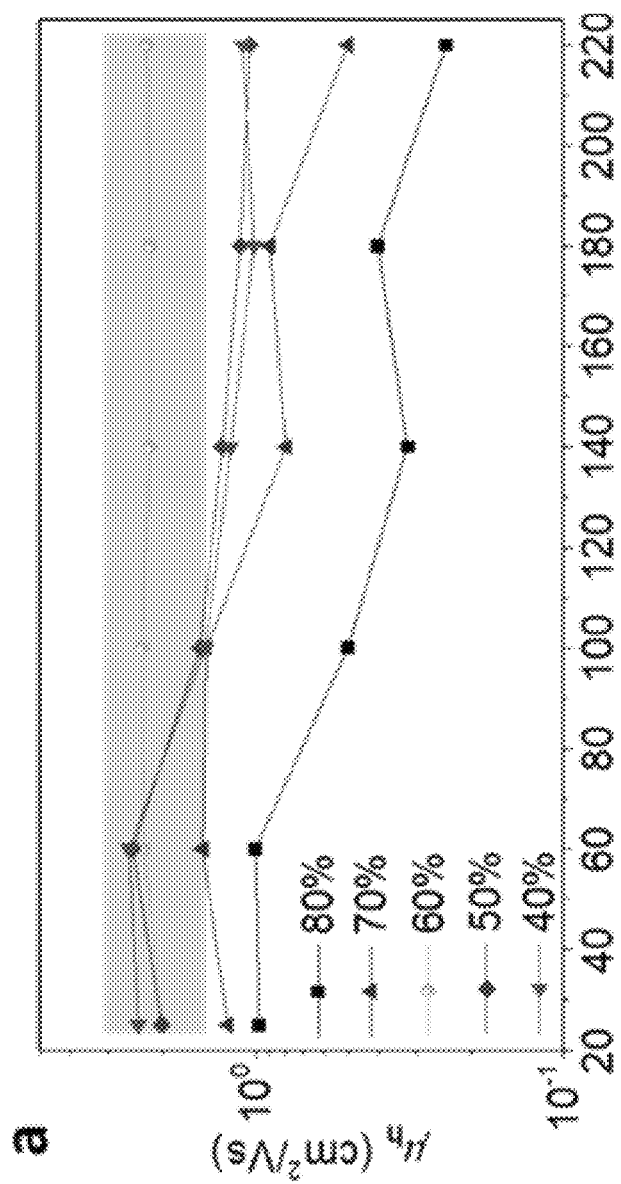
FIG. 2A shows temperature-dependent charge carrier mobility in OFET devices based on P1 blends containing various ratios of PVK.
Figure 2B:
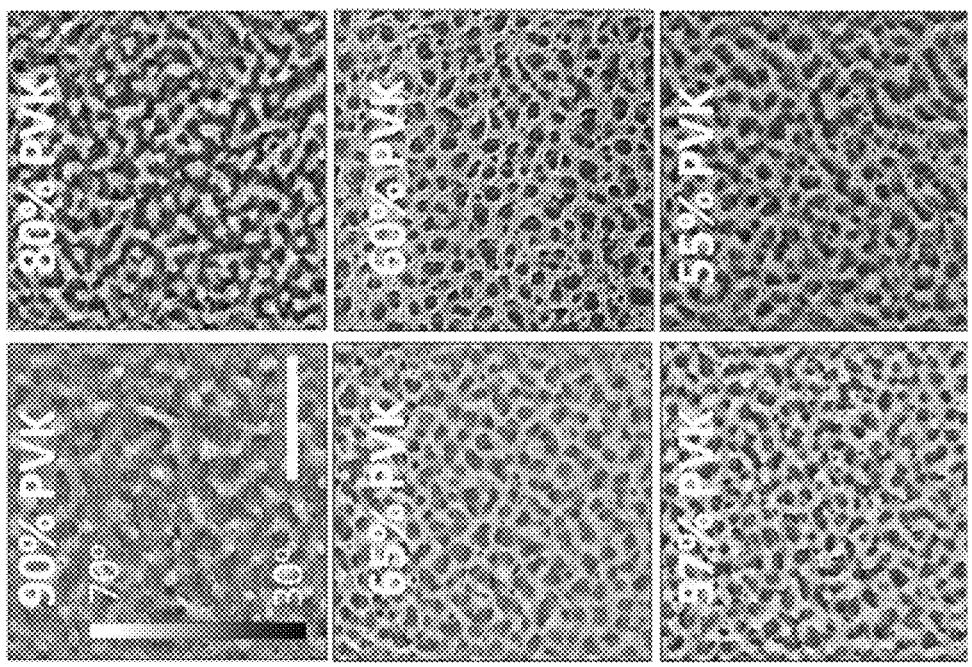
FIG. 2B shows AFM phase images of the spin-cast thin films of the polymer blends with various amounts of PVK added for vitrification. Polymer network interconnects could easily be formed with PVK loadings below 70%. Optimal connectivity was observed when near 60% PVK was added.
Figure 2C:
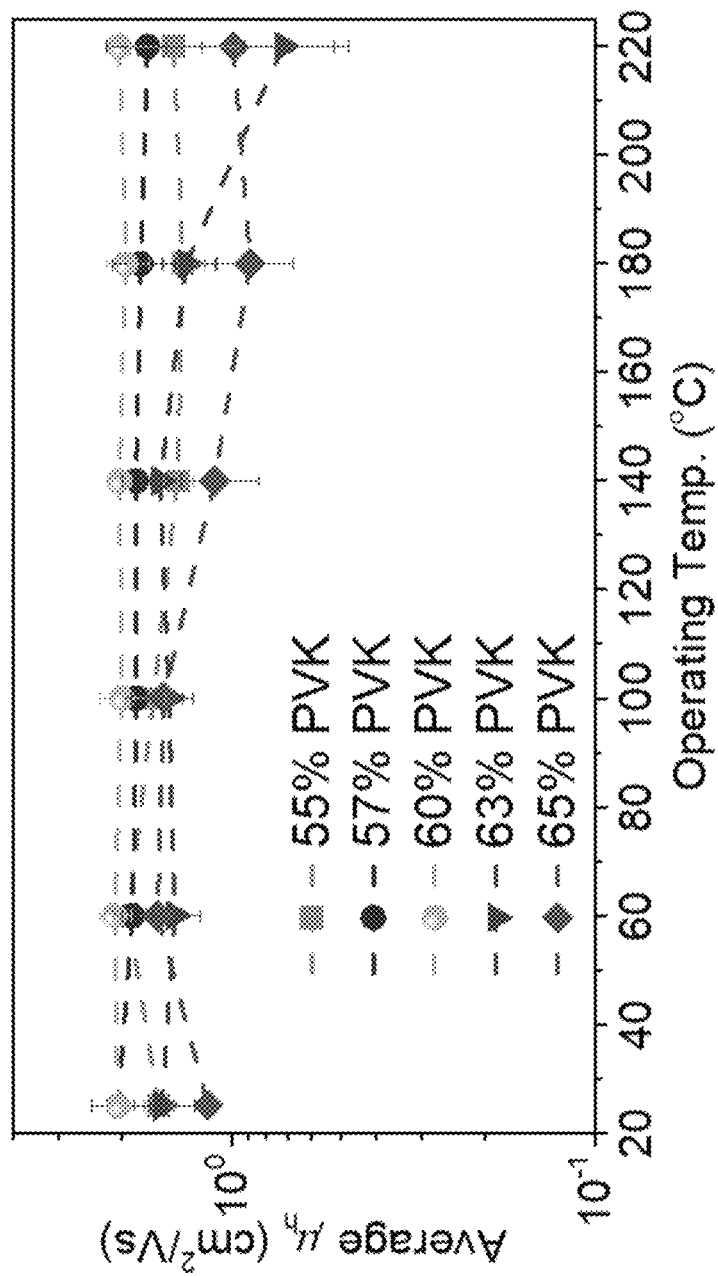
FIG. 2C shows measured OFET mobilities for devices based on optimized blending ratios.
Figure 2D:
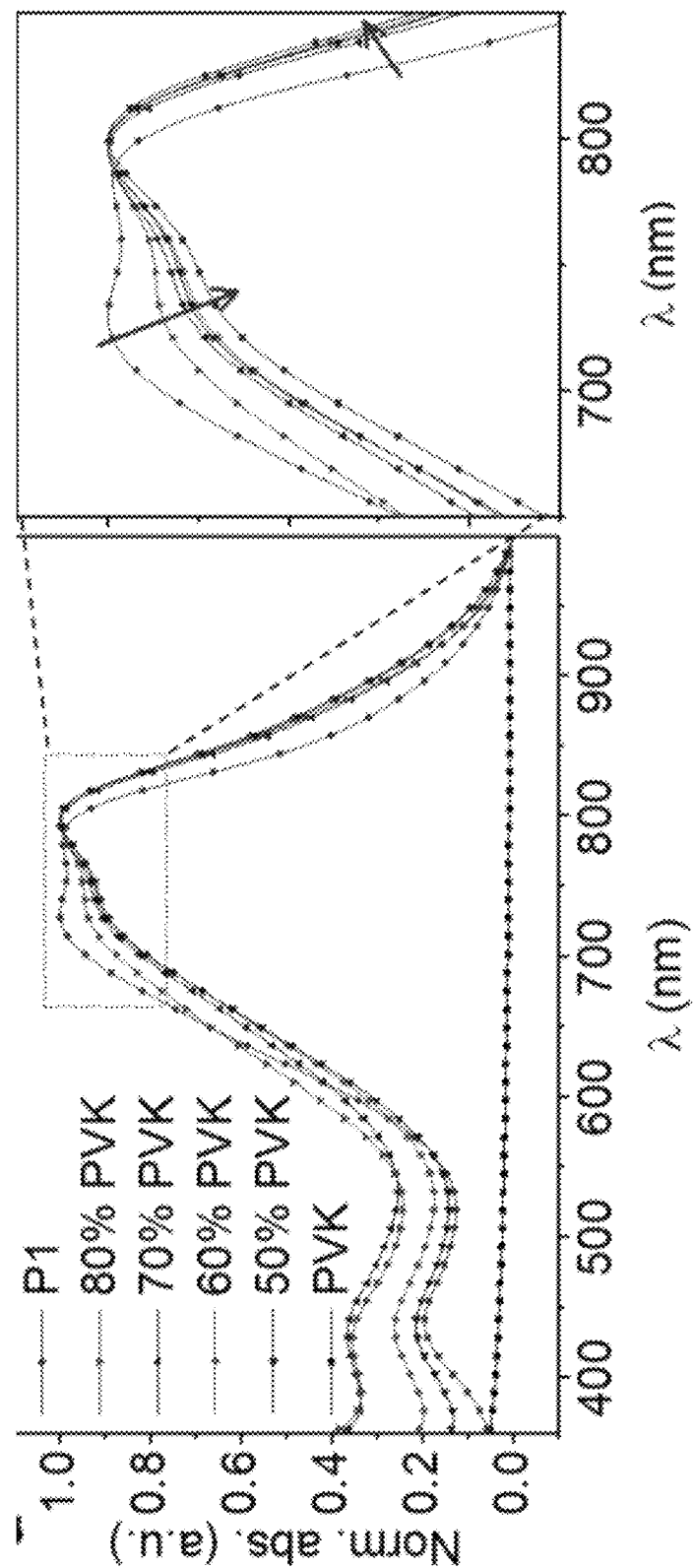
FIG. 2D shows UV-Vis absorption spectra of PVK-based blends.
Figure 2E:
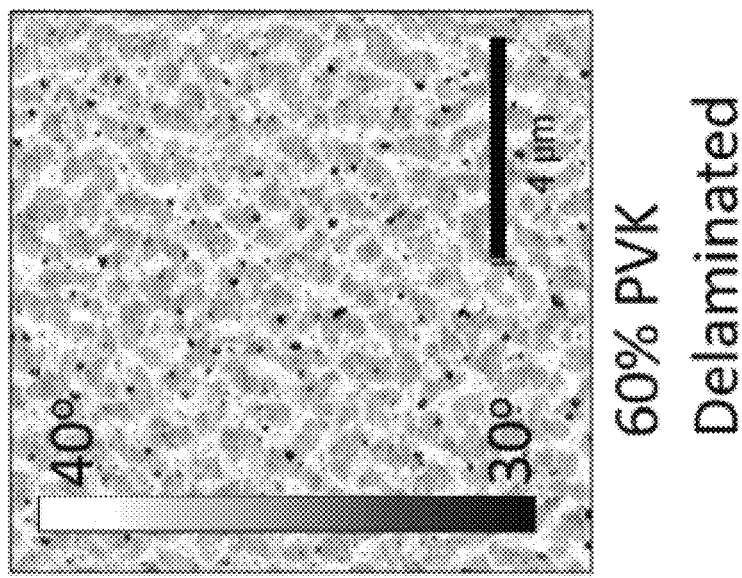
FIG. 2E shows bottom-face phase image of the delaminated film of the optimized blend revealed persistent interdigitation of semiconducting domains at the substrate interface. The scale bar is 4 μm.

FIG. 2A shows temperature-dependent charge carrier mobility in OFET devices based on P1 blends containing various ratios of PVK. FIG. 2B shows AFM phase images of the spin-cast thin films of the polymer blends with various amounts of PVK added for vitrification. Polymer network interconnects could easily be formed with PVK loadings below 70%. Optimal connectivity was observed when near 60% PVK was added. FIG. 2C shows measured OFET mobilities for devices based on optimized blending ratios. FIG. 2D shows UV-Vis absorption spectra of PVK-based blends. FIG. 2E shows bottom-face phase image of the delaminated film of the optimized blend revealed persistent interdigitation of semiconducting domains at the substrate interface. The scale bar is 4 µm.

To attain the interdigitation of the conjugated polymers within the matrix, the (semiconductor)/(matrix) blending volume of ratio was varied from 1/9 to 6/4 to establish interconnected morphology in spin-cast films (FIGS. 2A and 2B). The optimal blending ratio was found between 4/6 and 5/5 blending range. In this range, interconnected domains of P1 correlated to thermally-stable charge carrier properties. (FIGS. 2B and 2C). At higher loadings of the conjugated polymer in the blend, the matrix showed to be expelled resulting in a phase separation as observed from AFM phase images. This blending optimization also translated to improved long-range crystallization of P1 within the confined channels (FIGS. 2D and 2E).

Figure 3A:
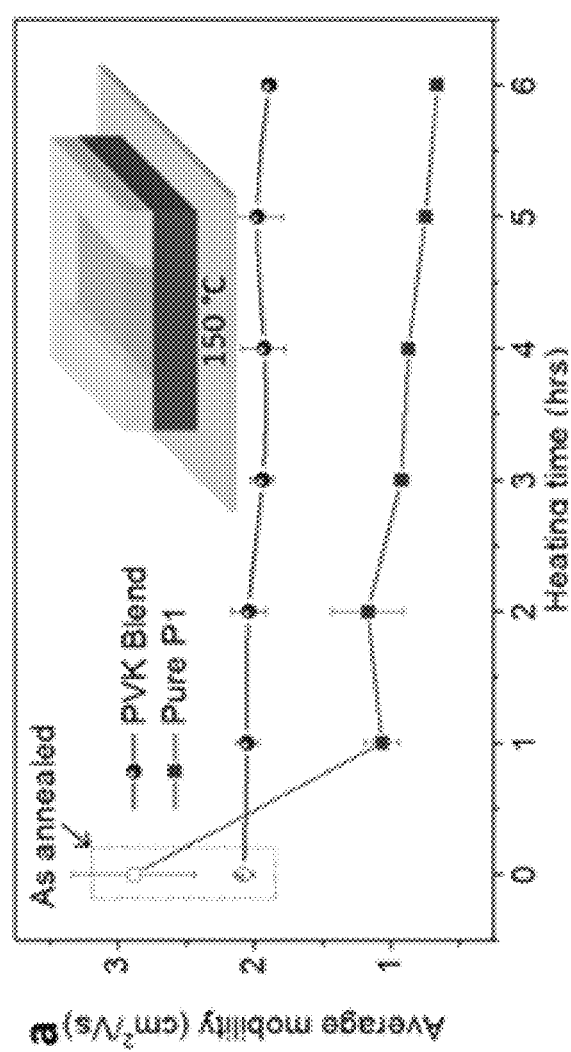
FIG. 3A shows the hole mobility of OFET devices measured under constant heating at 150° C. comparing the thermal stability of P1 and that of P1/PVK blend.
Figure 3B:
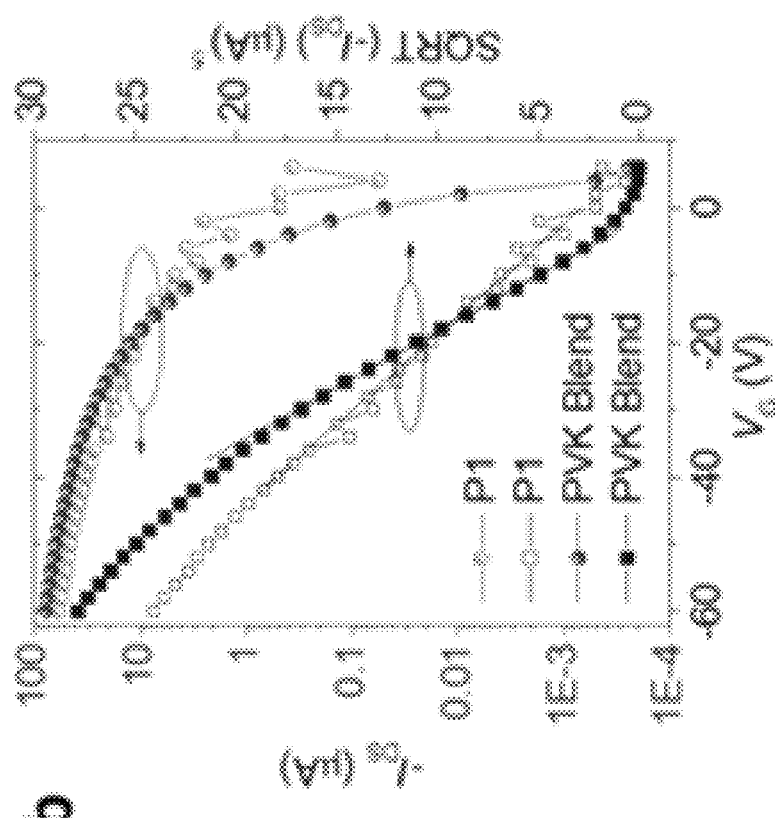
FIG. 3B shows the characteristic transfer curve of OFET devices after being heated for 1 hour at ambient.
Figure 3C:
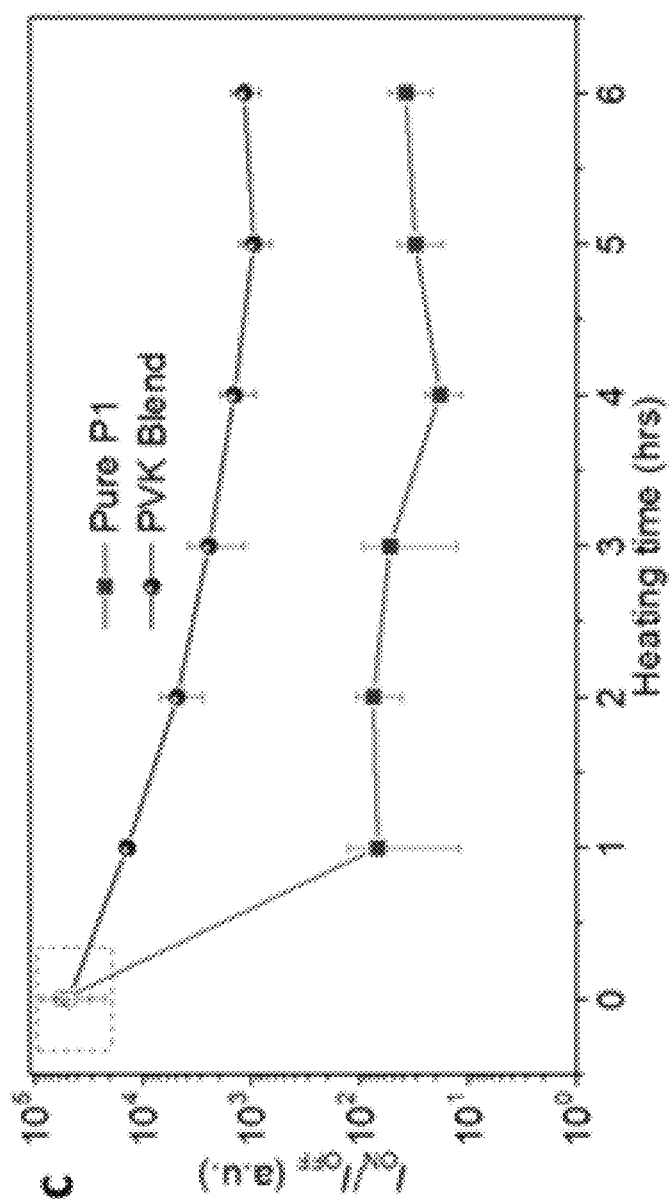
FIG. 3C shows the changes in $I_{ON}/I_{OFF}$ of OFET devices under heating at 150° C. at ambient FIG. 3D show the changes in threshold voltage when the OFET devices were subjected to constant heating at 150° C.
Figure 3D:
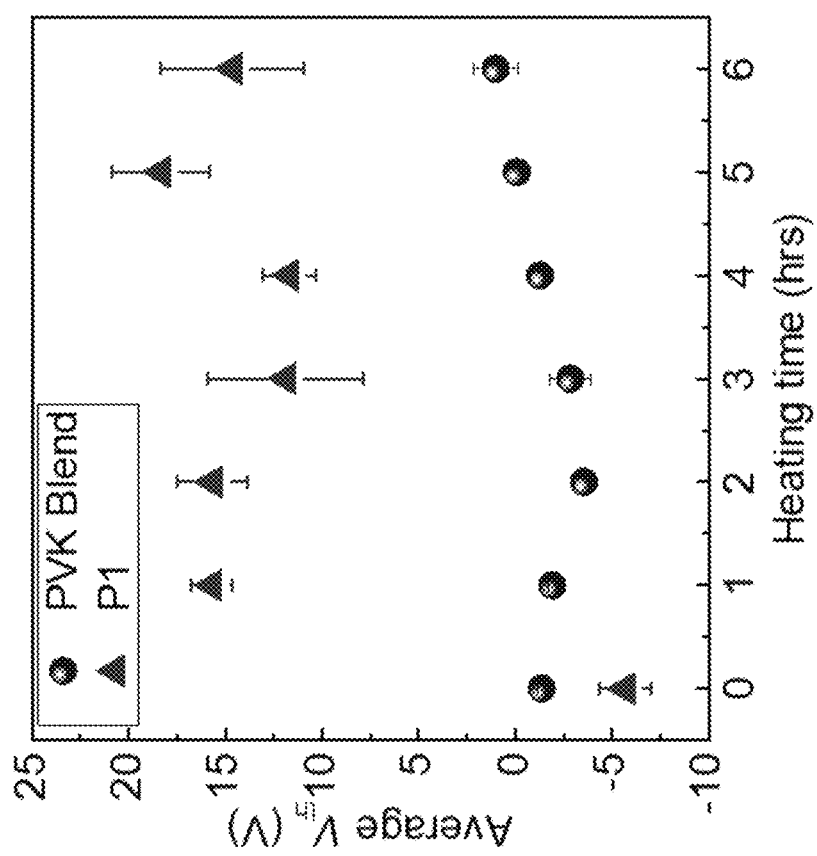

The thermal stability of the fabricated OFET devices was further evaluated from electrical measurements carried out under constant heating at 150° C. for at least 6 hours at ambient. FIG. 3A shows the hole mobility of OFET devices measured under constant heating at 150° C. comparing the thermal stability of P1 and that of P1/PVK blend. Referring to FIG. 3A, it can be seen that unlike the parent P1 under the same conditions, the devices based on PVK retained the original mobility up to six hours of heating. Due to the unstable morphologies and rearrangement observed in P1 films, the OFET devices made thereof showed detrimental charge scattering at higher temperatures leading to low $I_{ON}/I_{OFF}$ and increased threshold voltages. Conversely, the thermally-stabilized PVK blends showed excellent electrical properties even after as long as 6 hours of heating as described in FIGS. 3B through 3D. FIG. 3B Shows the characteristic transfer curve of OFET devices after being heated for 1 hour at ambient. FIG. 3C. Shows the changes in $I_{ON}/I_{OFF}$ of OFET devices under heating at 150° C. at ambient. FIG. 2D Shows the changes in threshold voltage when the OFET devices were subjected to constant heating at 150° C.

Figure 4A:
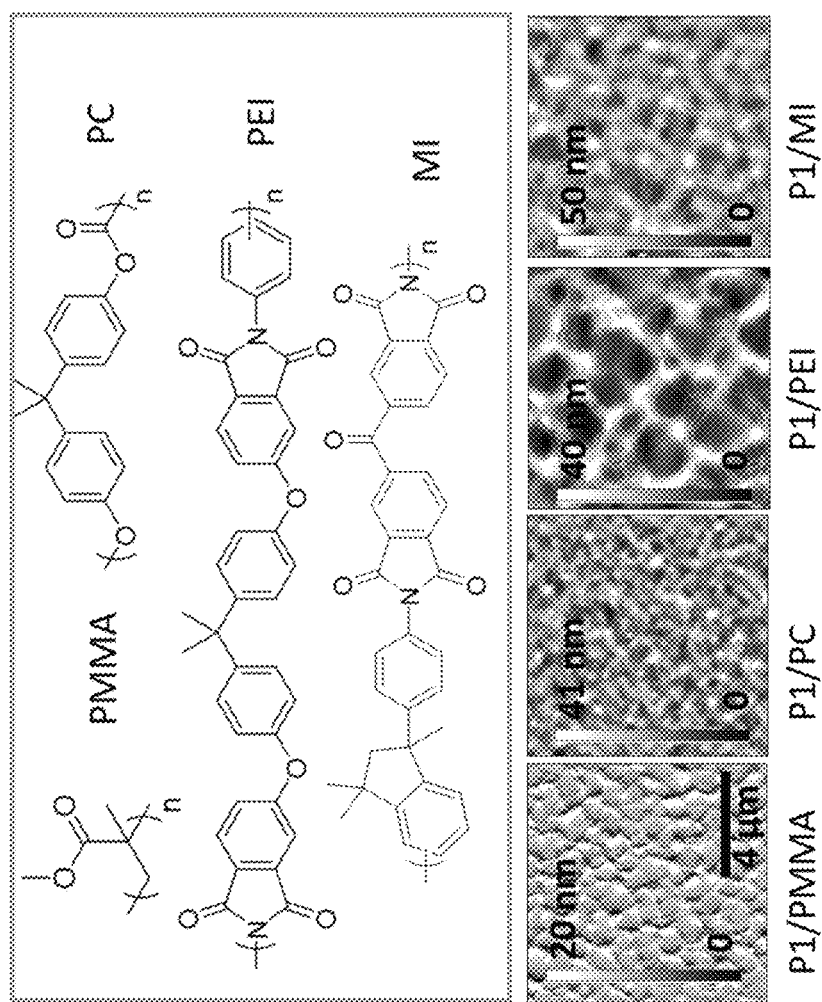
FIG. 4A shows molecular structures of the matrix polymers tested for thermally stability and the corresponding AFM height images revealing interdigitation morphology in with P1.
Figure 4B:
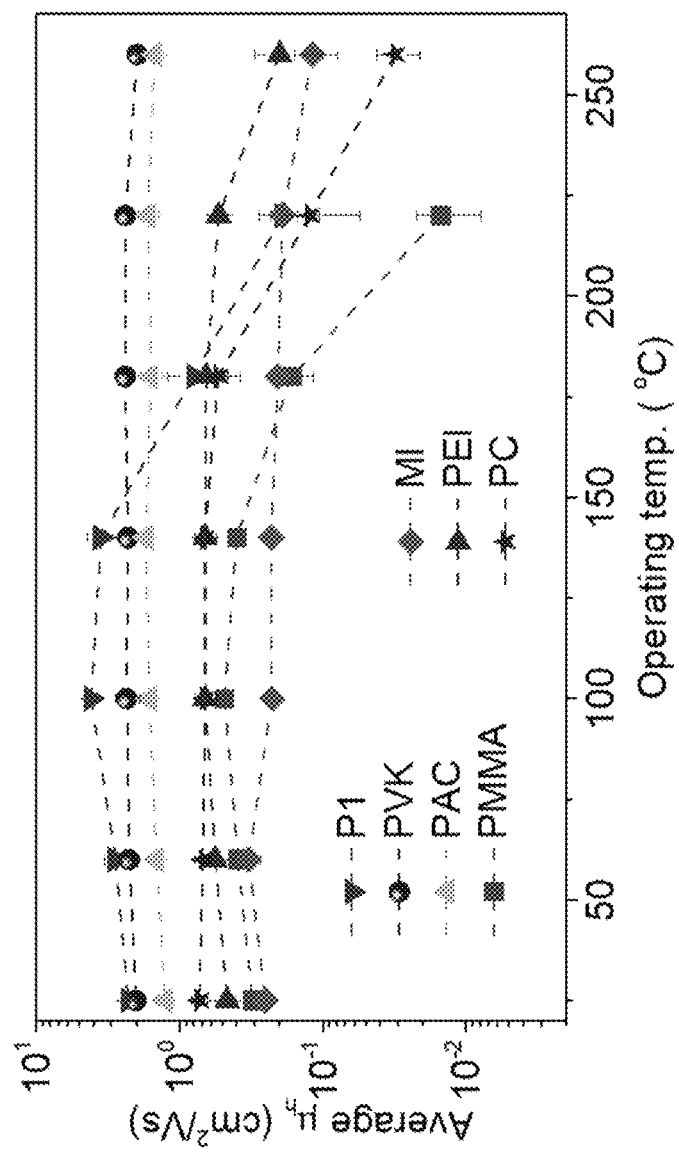
FIG. 4B shows hole mobilities of OFET devices based on the P1 blends in different host matrices measured in open air.
Figure 4C:
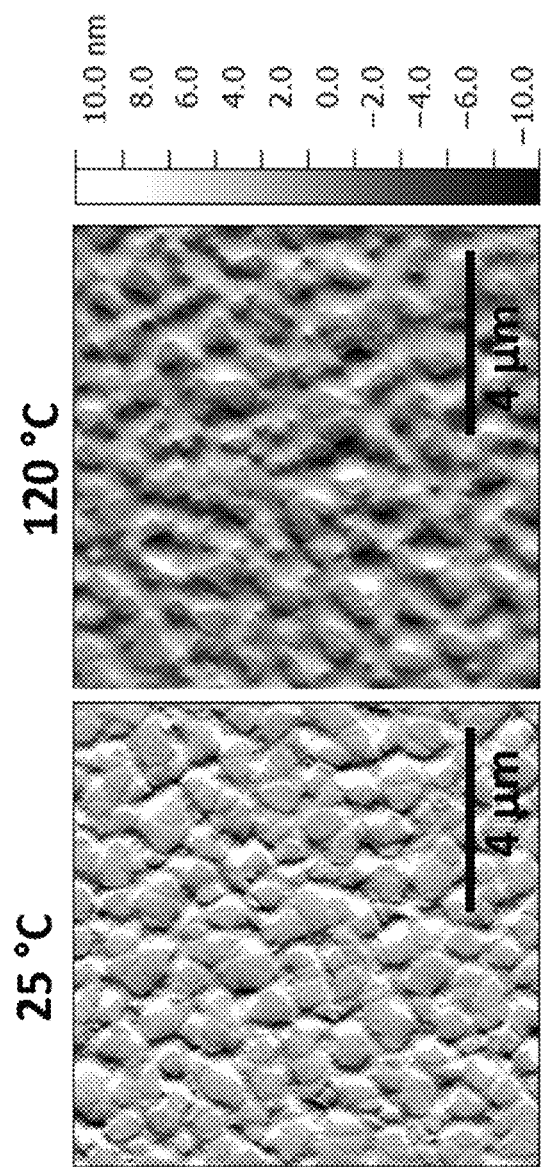
FIG. 4C shows AFM height images revealing morphology change of PMMA-based blend films upon heating.
Figure 4D:
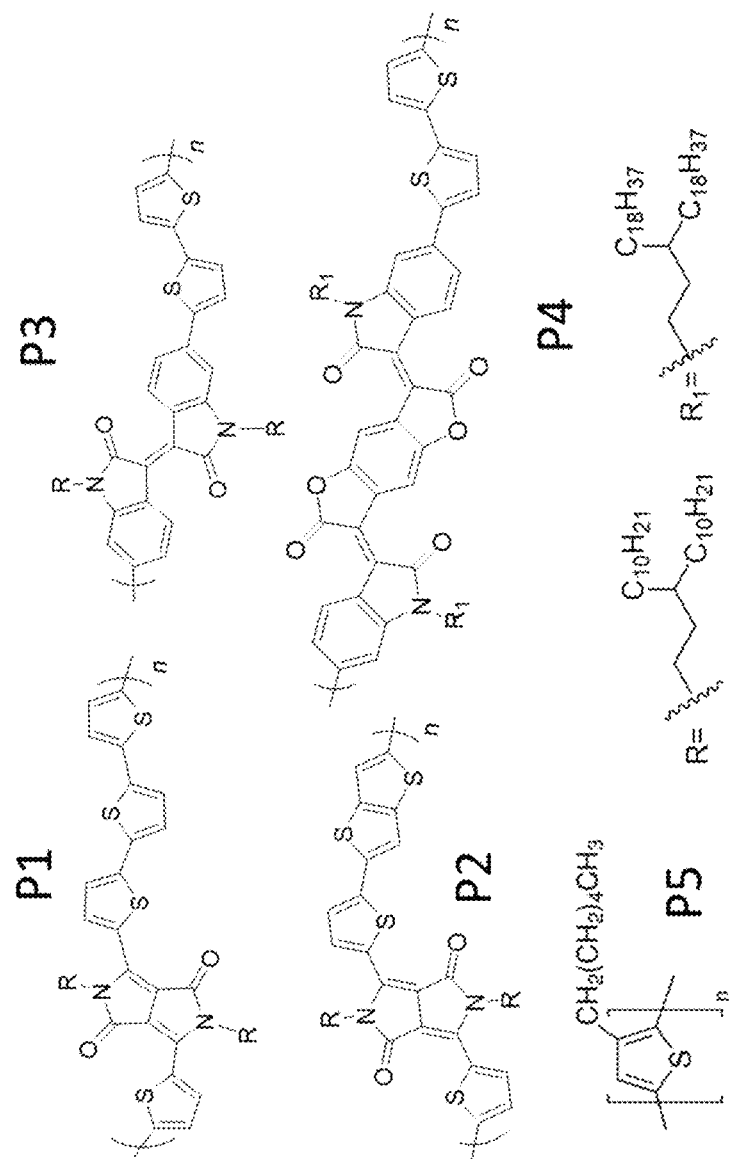
FIG. 4D shows donor-acceptor semiconducting polymers studied for thermally stable OFET devices.
Figure 4E:
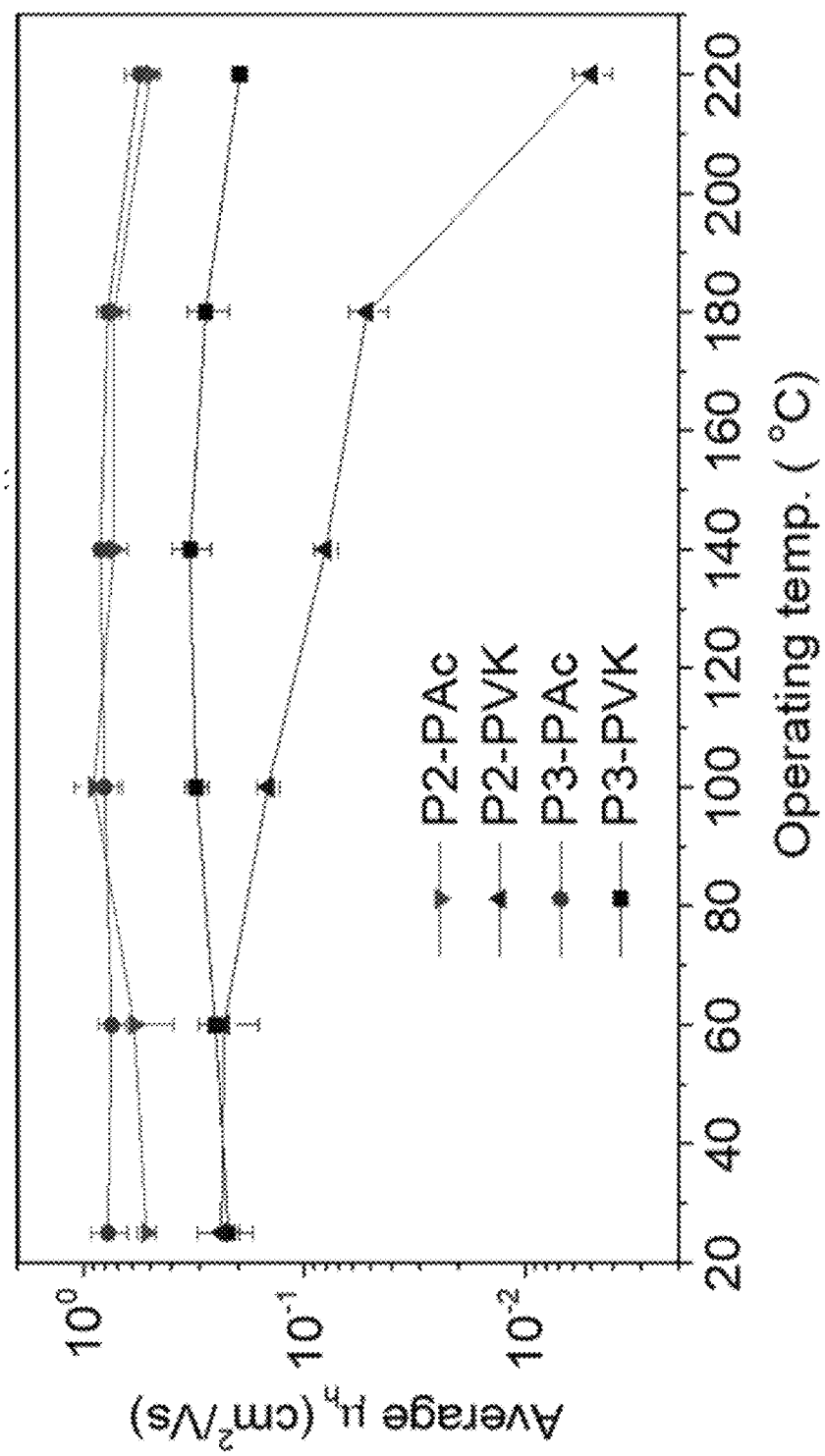
FIG. 4E shows measured temperature-dependent hole mobilities for the selected polymer pairs.

To probe the role of the matrix host in the thermal stabilized thin films, other matrix polymers were selected for comparison. Polyacenaphthalene (PAC, Tg~214° C.), and polymethylmethacrylate (PMMA, Tg~109° C.), polycarbonate (PC, Tg~200° C.), polyetherimide (PEI, Tg~260° C.), and Matrimid 5218 (MI, Tg~320° C.) were selected as high glass-transition matrix polymers. Referring to FIG. 4A, the chemical structures of the high glass-transition matrices and morphology of corresponding blends with P1 exhibiting interdigitated morphologies analogous PVK. Referring to FIG. 4B, Temperature dependent transistor analysis revealed that the blends of high Tg matrices could yield OFET devices stable up to 220° C. analogous to PVK. For PMMA, which has a much lower glass transition compared to other matrices, the devices based on it blend with P1 showed a decline in mobility at temperatures above 140° C. Referring to FIG. 4C, In situ morphology analysis of PMMA blend films further revealed significant changes once the heating temperature reaches the Tg of the matrix polymer. The proposed blending system was then probed on other high-performance donor-acceptor polymers to prove the concept. Referring to FIG. 4D the chemical structures of diketopyrrolopyrrole bithiophene-thiophene (P2), isoindigo-thiophene (P3), benzodifurandione-based oligo(p-phenylene vinylene) (P4), and poly-hexylthiophene (P5) as the commonly studied semiconducting polymers tested in this disclosure for thermal stability when blended with high Tg matrices. Referring to FIG. 4E, the representative blend pairs showing hole mobility stability up to 220° C. are shown.

Thus in this disclosure, semiconducting polymer blends able to retain their electronic properties at temperatures as high as 220° C. have been described. The blending system contains commonly studied donor-acceptor polymers with high glass transition temperature matrix as their vitrification medium. The use PVK as a high-Tg host matrix demonstrated OFETs device performance as high as high as 2.5 $cm^2/Vs$ even at temperatures beyond 200° C. with reasonable $I_{ON}/I_{OFF}$ as well as threshold voltages. These unprecedented high-temperature device performances show promising potential applications of this blending system for high-temperature organic electronics.

Based on the above studies, it is an objective of this disclosure to describe a composition for use as an electronic material. The composition contains at least one organic semiconducting material and at least one electrically insulating polymer with a glass transition temperature in the range of 120-400° C. The at least one organic semiconducting material and the at least one insulating polymer form a semiconducting blend wherein the at least one insulating polymer acts as a host or a matrix for the semiconducting material. The at least one insulating polymer and the at least one semiconducting material together form an interpenetrating morphology of the at least one insulating polymer and the at least one organic semiconductor material. The variation of charge carrier mobility in such a semiconducting blend with temperature is less than 20 percent in a temperature range 25° C. to t° C., where t° C. is less than the glass transition temperature of the polymer host. This result can be seen in the data presented in FIG. 1D. In some embodiments of the electronic material of this disclosure, the semiconducting material is a conjugated polymer. Non-limiting examples of a conjugated polymer as a semiconducting material of the compositions of this disclosure are poly-diketopyrrolopyrrole-thiophenes (P1, P2), poly-isoindigo-thiophenes (P3), benzodifurandione-based oligo(p-phenylene vinylene) (P4), as well as polythiophenes (P5). Examples of the electrically insulating polymer host of the compositions of this disclosure include, but not limited to polyvinyl carbazole (PVK), polyacenaphthalene (PAC), polycarbonate (PC), polyetherimide (PEI), and polyimide (MI). In some embodiments of the composition of the electronic material of this disclosure, the fraction of semiconductor material in the semiconducting blend is in the range of 0.05 to 0.8 by weight percent.

Figure 5:
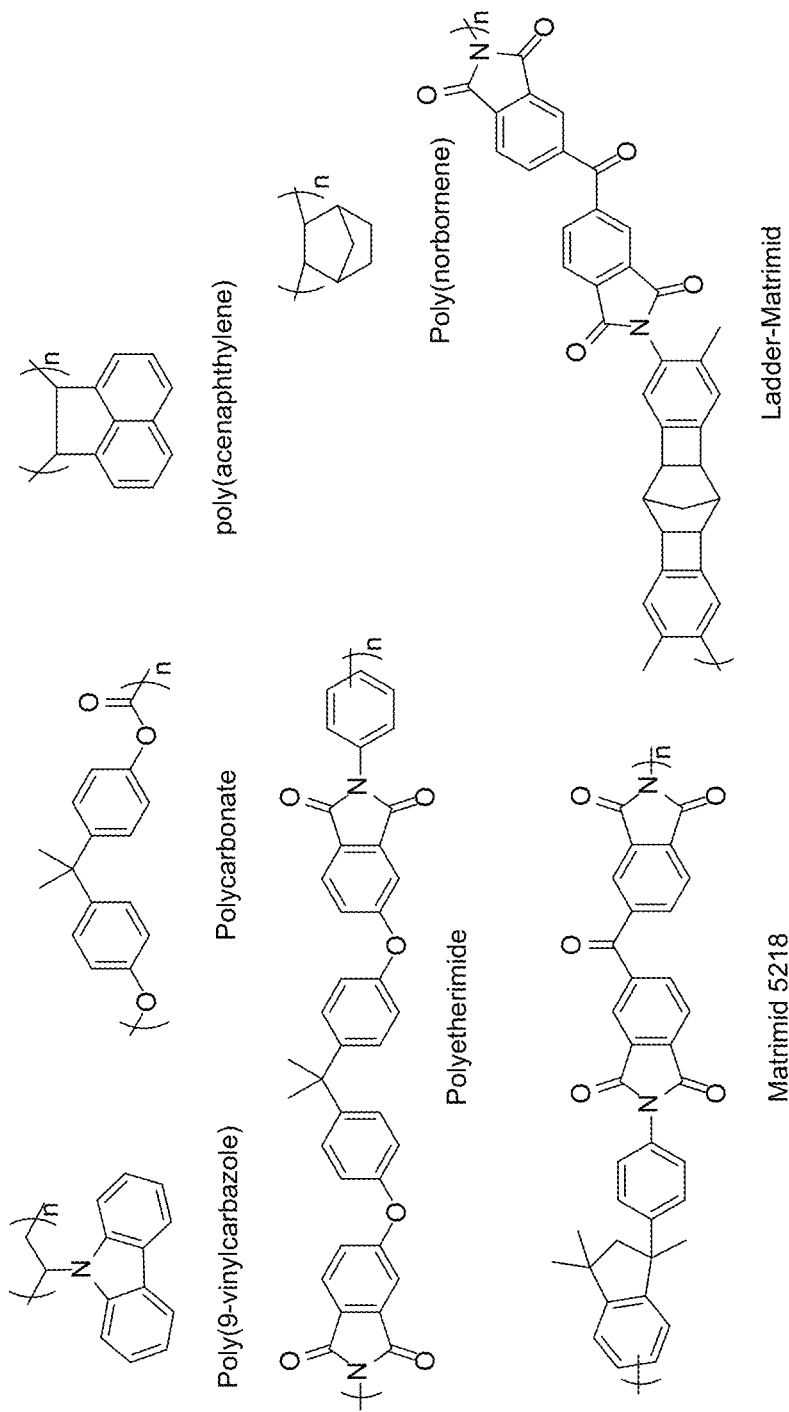
FIG. 5 shows several insulting polymer hosts suitable for making semiconducting blends of this disclosure
Figure 6:
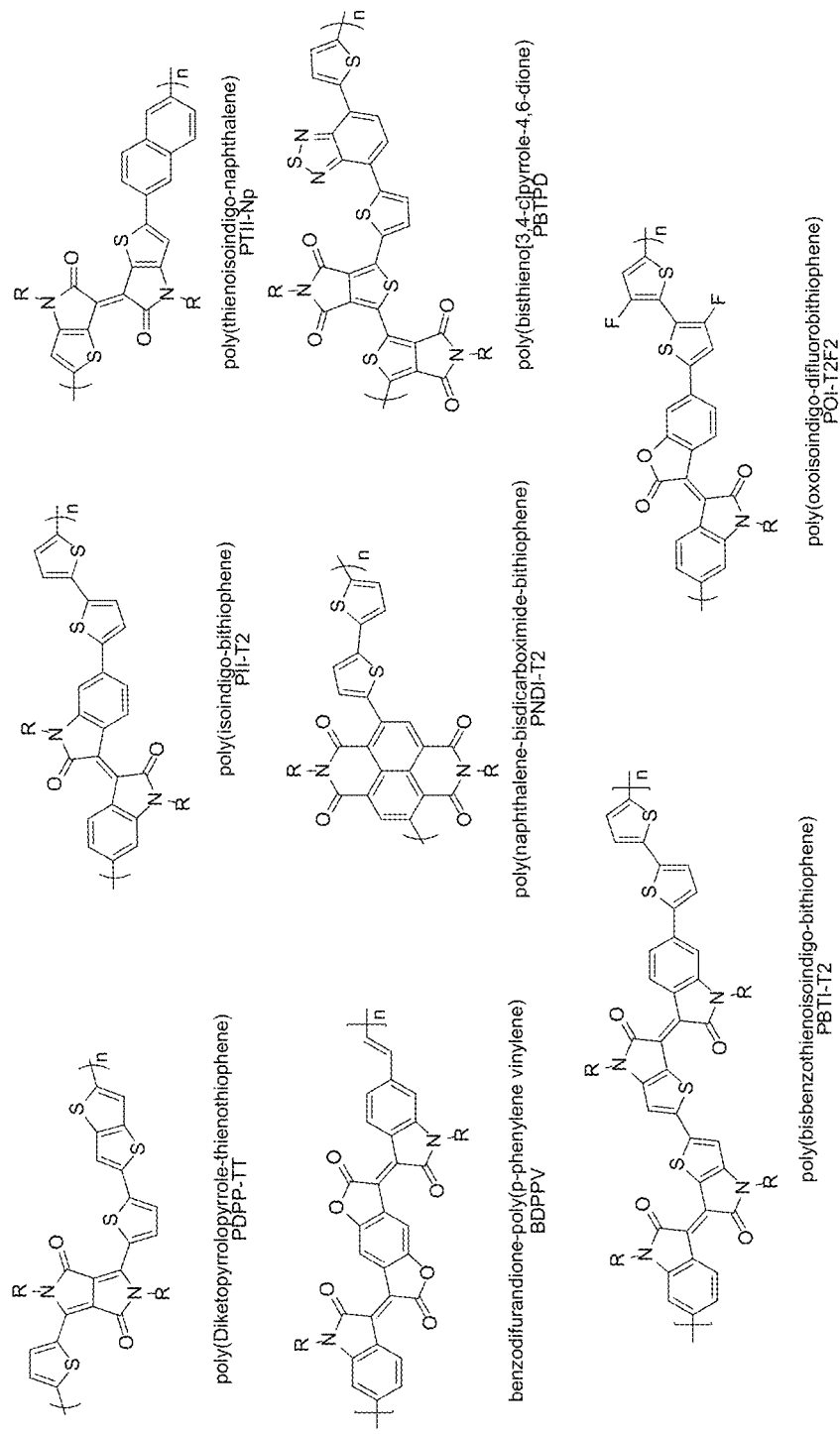
FIG. 6 shows several organic semiconductors suitable for making semiconducting blends of this disclosure.

It should be recognized that in some embodiments of the electronic material of this disclosure, it is possible to have more than one insulating polymer host and more than one organic semiconductor. For example, we can have an electronic material with PVK and PAC as hosts and P1 as the organic semiconductor. In such a case PVK and PAC would together form the host matrix while P1 will act as the interpenetrating organic semiconductor. Similarly, it is possible to make a blend utilizing PVK as the insulating polymer matrix for, say, two organic semiconductors P1 and P2. Those skilled in the art will readily recognize other variations of combining the insulating polymer hosts and organic semiconductors. Several insulating polymer hosts suitable for making semiconducting blends of this disclosure are shown in FIG. 5 along with their structures. Also, several organic semiconductors suitable for making semiconducting blends of this disclosure are shown in FIG. 6 along with their structures.

It is another objective of this disclosure to describe a method of making a film of an electronic material. The method includes dissolving at least one organic semiconducting material and at least one insulating polymer into an organic solvent in a pre-determined ratio resulting in a semiconducting blend, depositing the blend onto a substrate to form a film, evaporating the organic solvent, resulting in a semiconducting film. In the resulting semiconductor film, the at least one insulating polymer acts as a matrix for the at least one organic semiconducting material and the at least one insulating polymer and the at least one organic semiconducting material together form an interpenetrating morphology of the insulating polymer and the organic semiconductor material.

A non-limiting example of a substrate suitable for this method is silicon wafer. In some embodiments of the method, the film can be an electronic device. A non-limiting example of such an electronic device is a transistor.

While the present disclosure has been described with reference to certain embodiments, it will be apparent to those of ordinary skill in the art that other embodiments and implementations are possible that are within the scope of the present disclosure without departing from the spirit and scope of the present disclosure.

The invention claimed is:

1. A method of making a film of an electronic material, the method comprising:
   dissolving at least one organic semiconducting material and at least one insulating polymer with a glass transition temperature in the range of 120-400° C. into an organic solvent in a pre-determined ratio resulting in a semiconducting blend;
   depositing the blend onto a substrate to form a film,
   evaporating the organic solvent, resulting in a semiconducting film,
wherein the at least one insulating polymer acts as a matrix for the at least one organic semiconducting material and the at least one insulating polymer and the at least one organic semiconducting material together form an interpenetrating morphology of the at least one insulating polymer and the at least one organic semiconductor material, and wherein a variation of charge carrier mobility in the semiconducting blend with temperature is less than 20 percent in a temperature range of 25 to t ° C., where t ° C. is 100° C. or greater and less than the glass transition temperature of the at least one insulating polymer.

2. The method of claim 1, wherein the at least one organic semiconducting material is one of diketopyrrolopyrrole-thiophenes (P1, P2), poly-isoindigo-thiophenes (P3), benzodifurandione-based oligo(p-phenylene vinylene) (P4), and polythiophenes (P5).

3. The method of claim 1, wherein the at least one insulating polymer is one of polyvinyl carbazole (PVK), polyacenaphthalene (PAC), polycarbonate (PC), polyetherimide (PEI), and polyimide (MI).

4. The method of claim 1, wherein the substrate is silicon wafer.

5. The method of claim 1, wherein the film is an electronic device.

6. The method of claim 5, wherein the electronic device is a transistor.

* * * * *